United States Patent
Ns et al.

(10) Patent No.: US 10,128,248 B1
(45) Date of Patent: Nov. 13, 2018

(54) AGING TOLERANT APPARATUS

(71) Applicant: Intel Corporation, Santa Clara, CA (US)

(72) Inventors: Karthik Ns, Bangalore (IN); Dharmaray Nedalgi, Bangalore (IN); Vani Deshpande, Bangalore (IN); Leonhard Heiss, Warngau (DE); Amit Kumar Srivastava, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/650,271

(22) Filed: Jul. 14, 2017

(51) Int. Cl.
| *H01L 29/76* | (2006.01) |
| *H01L 27/105* | (2006.01) |
| *H01L 23/58* | (2006.01) |
| *H01L 23/00* | (2006.01) |

(52) U.S. Cl.
CPC .......... *H01L 27/105* (2013.01); *H01L 23/562* (2013.01); *H01L 23/564* (2013.01); *H01L 23/58* (2013.01)

(58) Field of Classification Search
CPC ... H01L 27/105; H01L 23/562; H01L 23/564; H01L 23/58
USPC .......................................................... 257/67
See application file for complete search history.

(56) References Cited

U.S. PATENT DOCUMENTS

| 4,823,318 | A  | * | 4/1989 | D'Arrigo | ............... | G11C 16/08 365/185.23 |
| 6,359,478 | B1 |   | 3/2002 | Chow |||
| 8,928,354 | B2 |   | 1/2015 | Kim |||
| 2006/0164152 | A1 | * | 7/2006 | Tschanz | ................ | G05F 3/205 327/530 |
| 2009/0128211 | A1 | * | 5/2009 | Saito | ................ | H03K 3/356113 327/210 |
| 2011/0102064 | A1 |   | 5/2011 | Noorlag et al. |||
| 2014/0268439 | A1 |   | 9/2014 | Su et al. |||
| 2017/0018304 | A1 |   | 1/2017 | Morris et al. |||

OTHER PUBLICATIONS

International Search Report and Written Opinion from PCT/US2018/037587 dated Oct. 5, 2018, 16 pgs.

* cited by examiner

*Primary Examiner* — Tu-Tu Ho
(74) *Attorney, Agent, or Firm* — Green, Howard & Mughal LLP

(57) ABSTRACT

An apparatus is provided which comprises: a stack of transistors of a same conductivity type, the stack including a first transistor and a second transistor coupled in series and having a common node; and a feedback transistor of the same conductivity type coupled to the common node and a gate terminal of the first transistor of the stack.

20 Claims, 12 Drawing Sheets

1

AGING TOLERANT APPARATUS

BACKGROUND

Complementary Metal Oxide Semiconductor (CMOS) transistors developed in FinFET (Fin Field Effect Transistor) technologies generally suffer from enhanced aging degradation as compared to transistors developed in planar technologies. Digital circuit performance is degraded due to aging in two ways: (1) functional degradation, which is due to aging circuits stop performing or degrade significantly over lifetime, and (2) device failure, which is due to excessive aging that triggers an irreversible dielectric breakdown of transistors, leading to an instantaneous failure of the corresponding circuit. Due to the exponential voltage dependency of aging, digital circuits age where transistors are exposed to voltages beyond the CMOS device operating limits. One of the digital circuit topologies where internal nodes are exposed to voltages beyond the device target limit are stacked transistor configurations.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
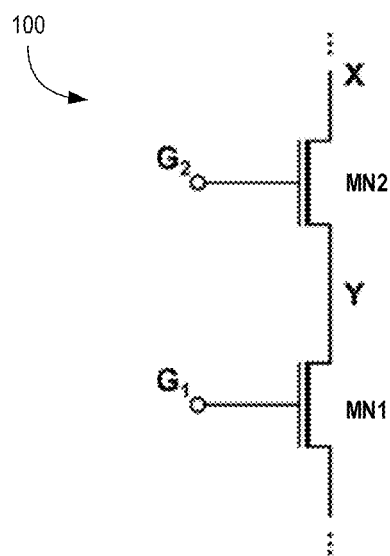
FIG. 1A illustrates a stacked circuit configuration.

Some embodiments describe an aging tolerant circuit which is to clamp a high impedance node to a well-defined, fixed voltage. Some embodiments use the aging tolerant circuit technique for an 'N' number of stacked transistors, and this technique is also applicable to all digital circuits that use stacked n-type and p-type devices. Some embodiments ensure that in a situation where the signal at an intermediate node within a stack of transistors is affected by noise and/or coupling, that there is an alternate charge/discharge path to clamp the voltage on that node to a defined voltage.

There are many technical effects of the various embodiments. For example, the aging tolerant circuit or apparatus of some embodiments prevents device operating voltages to go beyond, as specified by process for stacked n-type transistor and/or p-type transistor configurations, by clamping all affected internal nodes to defined voltage levels. The aging tolerant circuit or apparatus of some embodiments avoids the excessive degradation of transistors, digital circuits and circuit malfunctions. In some embodiments, for a ring oscillator (RO) circuit using a stack of transistors, the frequency degradation with the aging tolerant circuit may be much lower than without the aging tolerant circuit.

For example, frequency degradation for a RO without aging tolerant circuit may be 45% in 10 years, and 14% in 10 years with the aging tolerant circuit. In another example, drive current reduction for the RO may be much lower than without the aging tolerant circuit. For instance, for the stacked based RO, drive current reduction after 10 years may be 80% without using aging tolerant circuit, and 28% with aging tolerant circuit for the same period. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For the purposes of present disclosure the terms "spin" and "magnetic moment" are used equivalently. More rigorously, the direction of the spin is opposite to that of the magnetic moment, and the charge of the particle is negative (such as in the case of electron).

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Due to the exponential voltage dependency of aging, digital circuits age where transistors are exposed to voltages beyond the CMOS device operating limits. One of the digital circuit topologies where internal nodes are exposed to voltages beyond the device target limit are stacked transistor configurations.

FIG. 1A illustrates a stacked circuit configuration 100. Configuration 100 is widely used for circuits like logic circuits, I/O (input-output) interfaces, DC-DC converters, power amplifiers, etc. Stacked circuit configuration 100 comprises two stacked n-type transistors referred to as transistors MN1 and MN2. Here, n-type transistors are shown in a stack configuration, however the problems of aging are also applicable to p-type transistors in a stack. To avoid excessive aging of devices, the voltage between the two transistor terminals (e.g., between the gate and the source or between the drain and the source) are limited to a maximum voltage $V_{max}$. Typically $V_{max}=1.1\ V_{DD,nom}$ is used as a limit, where $V_{DD,nom}$ is the nominal supply voltage of the corresponding device.

Figure 1B:
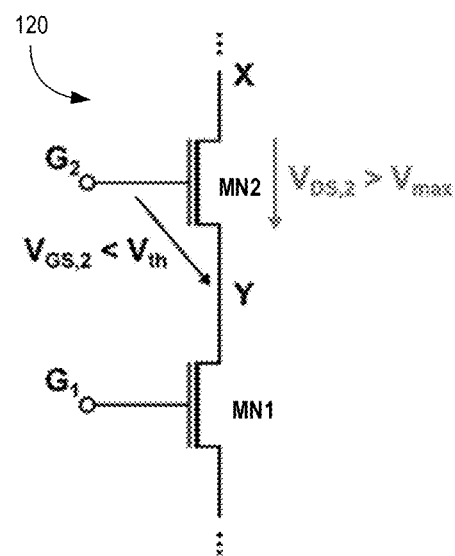
FIG. 1B illustrates the stacked circuit configuration when a transistor in the stack is off which may cause excessive aging and a failure of that transistor.

FIG. 1B illustrates the stacked circuit configuration 120 when transistor in the stack is off which may cause excessive aging and a failure of that transistor. During the design of stacked topologies, special attention is given to the drain source voltage of the upper transistor MN2, $V_{DS,2}$. When transistor MN2 is turned off, e.g., when the gate source voltage of transistor MN2, $V_{DS,2}$, is smaller than or equal the threshold voltage $V_{th}$ of transistor MN2 (e.g., $V_{GS,2}<V_{th}$), $V_{DS,2}$ can become higher than $V_{max}$ (e.g., $V_{DS,2}>V_{max}$) as node 'Y' is a high impedance node (e.g., floating node) which is susceptible to any coupling or noise. Here, the term "$V_{max}$" is the voltage above which a transistor of a process node is damaged if that voltage is applied for a certain amount of time. Excessive voltage beyond the operating limits can lead to device degradation due to aging, and thus a failure of transistor MN2, and may limit the circuit functionality.

As FinFET geometry shrink to 14 nm or 10 nm or 7 nm, device geometry is more susceptible to aging than planer transistors. Even moderate operating voltage, beyond the one specified by a process node, lead to a failure for standard circuit topologies. Similar problems may also exist for some of the external small geometry processes either planar or silicon-on-insulator (SOI) technologies. One of the solutions to overcome aging is to reduce the supply voltage to give more headroom for operating voltages. However, reducing supply voltage limits circuit operation and limits circuit driving capability, thereby leading to timing violations across integrated circuit (IC) chips. Various embodiments provide an aging tolerant circuit technique which mitigates aging at smaller process geometries.

Figure 2:
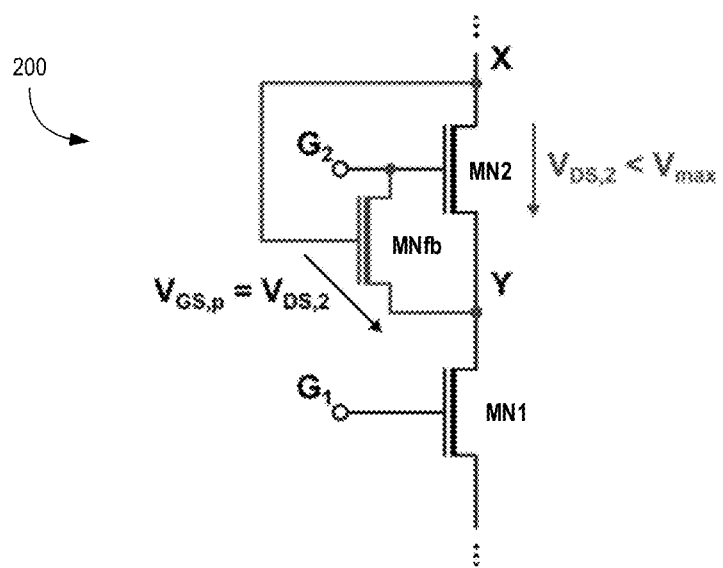
FIG. 2 illustrates a stacked circuit configuration with aging tolerant apparatus, according to some embodiments of the disclosure.

FIG. 2 illustrates a stacked circuit configuration 200 with aging tolerant apparatus, according to some embodiments of the disclosure. It is pointed out that those elements of FIG. 2 having the same reference numbers (or names) as the elements of any other figure can operate or function in any manner similar to that described, but are not limited to such. Here, the stacked circuit configuration 200 comprises first n-type transistor MN2 coupled in series with a second n-type transistor MN1 such that node 'Y' is the common node. In some embodiments, aging tolerant apparatus comprises a feedback transistor MNfb of the same conductivity type (e.g., n-type) coupled to the common node 'Y' and a gate terminal of the first transistor MN2 of the stack. In some embodiments, the feedback transistor MNfb includes a gate terminal which is coupled to the first transistor MN2 of the stack. In some embodiments, the gate terminal of the first transistor MN2, and a gate terminal of the second transistor MN2 are controllable by two separate control nodes "$G_2$" and "$G_1$", respectively. In some embodiments, the feedback transistor MNfb is smaller in size than one of the first or second transistors. For example, the feedback transistor MNfb is 75% smaller in width than the width of either of the first transistor MN2 or the second transistor MN2. In some embodiments, the feedback transistor can be sized also larger than the stacked transistors.

In some embodiments, the aging tolerant circuit keeps the internal nodes of the stacked circuit topology within a defined operating voltage range. In some embodiments, feedback transistor MNfb is coupled between nodes "$G_2$" and 'Y', with the gate coupled to node 'X'. In some embodiments, the feedback transistor MNfb limits $V_{DS,2}$ to a value below $V_{max}$ and thus prevents excessive degradation and failure of transistor MN2. Two operation cases of the circuit are described here.

In the first case, transistor MN2 is off (e.g., $V_{GS,2} < V_{th}$), and $V_{DS,2} > V_{max}$ possible. In this scenario, as soon as $V_{DS,2}$ starts exceeding $V_{th}$, transistor MNfb is turned on. Transistor MNfb now provides an additional charge/discharge path for node 'Y', in accordance with some embodiments. This may raise the voltage at node 'Y' to the voltage at the gate of transistor MN2, thereby decreasing and limiting $V_{DS,2} = V_x - V_Y$ to a value below $V_{max}$.

In the second case, transistor MN2 is on (e.g., $V_{GS,2} > V_{th}$), and $V_{DS,2} > V_{max}$ not possible. In this scenario, $V_{DS,2} = V_{GS,P} = 0$ i.e., transistor MNfb is switched off and does not further impact the overall circuit functionality.

Figure 3:
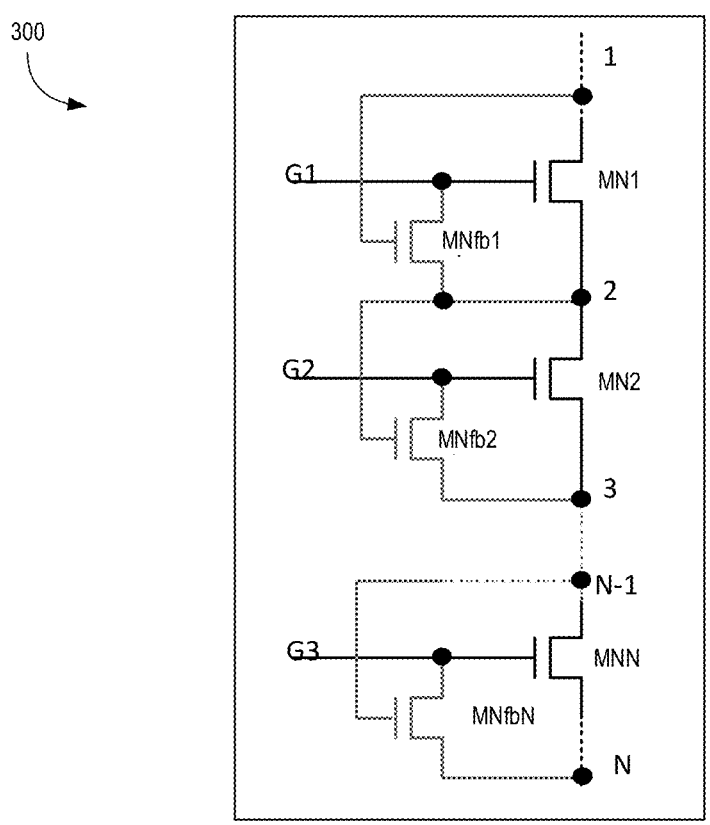
FIG. 3 illustrates an 'N' stacked circuit configuration with aging tolerant apparatuses, according to some embodiments of the disclosure.

FIG. 3 illustrates an 'N' stacked circuit configuration 300 with aging tolerant apparatuses, according to some embodiments of the disclosure. It is pointed out that those elements of FIG. 3 having the same reference numbers (or names) as the elements of any other figure can operate or function in any manner similar to that described, but are not limited to such. The 'N' stacked circuit configuration 300 comprises 'N' transistors MN1 through MNN coupled in series. In some embodiments, a feedback transistor is associated with each transistor in the stack. Here, 'N' feedback transistors MNfb1 through MNfbN are shown that are coupled to internal nodes as shown. For example, the gate of feedback transistor MNfbN is coupled with node "N−1", the drain to gate GN and the source to node 'N'.

Figure 4A:
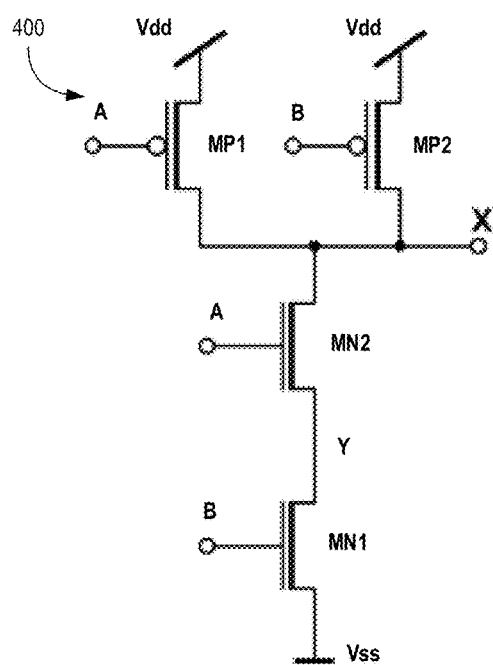
FIG. 4A illustrates a NAND logic gate circuit which suffers from aging failure.

FIG. 4A illustrates a NAND logic gate circuit 400 which suffers from aging failure. NAND logic gate circuit 400 comprises p-type transistors MP1 and MP2, and n-type transistors MN1 and MN2 coupled together as shown such that transistors MP1 and MN2 are controlled by node 'A' providing signal 'A', and transistors MP2 and MN1 are controlled by node 'B' providing signal 'B'. For example, NAND gate circuit 400 may be part of a ring oscillator (RO) which is designed for industrial applications where a lifetime in the range 5 to 10 years is demanded. Here, the stack of transistors MN2 and MN1 is similar to the stack shown in FIGS. 1A-B, and suffer from the same problems.

NAND logic gate circuit 400 depicts the schematic of a single NAND RO stage, which is the state-of-the-art. In the state-of-the art solution, transistor MN2 may be operating beyond the device voltage limits which will lead to an excessive aging of the entire RO.

Figure 4B:
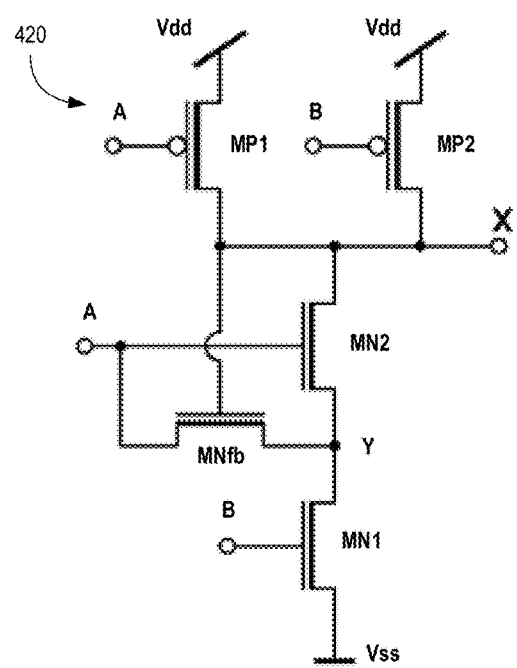
FIG. 4B illustrates a NAND logic gate circuit with aging tolerant apparatus, according to some embodiments of the disclosure.

FIG. 4B illustrates a NAND logic gate circuit 420 with aging tolerant apparatus, according to some embodiments of the disclosure. It is pointed out that those elements of FIG. 4B having the same reference numbers (or names) as the elements of any other figure can operate or function in any manner similar to that described, but are not limited to such. NAND logic gate circuit 420 includes aging tolerant apparatus which comprises transistor MNfb coupled to nodes 'Y' and 'A', and controllable by node 'X' as shown. The behavior of transistor MNfb in NAND logic gate circuit 420 is same as transistor MNfb in FIG. 2.

Figure 5:
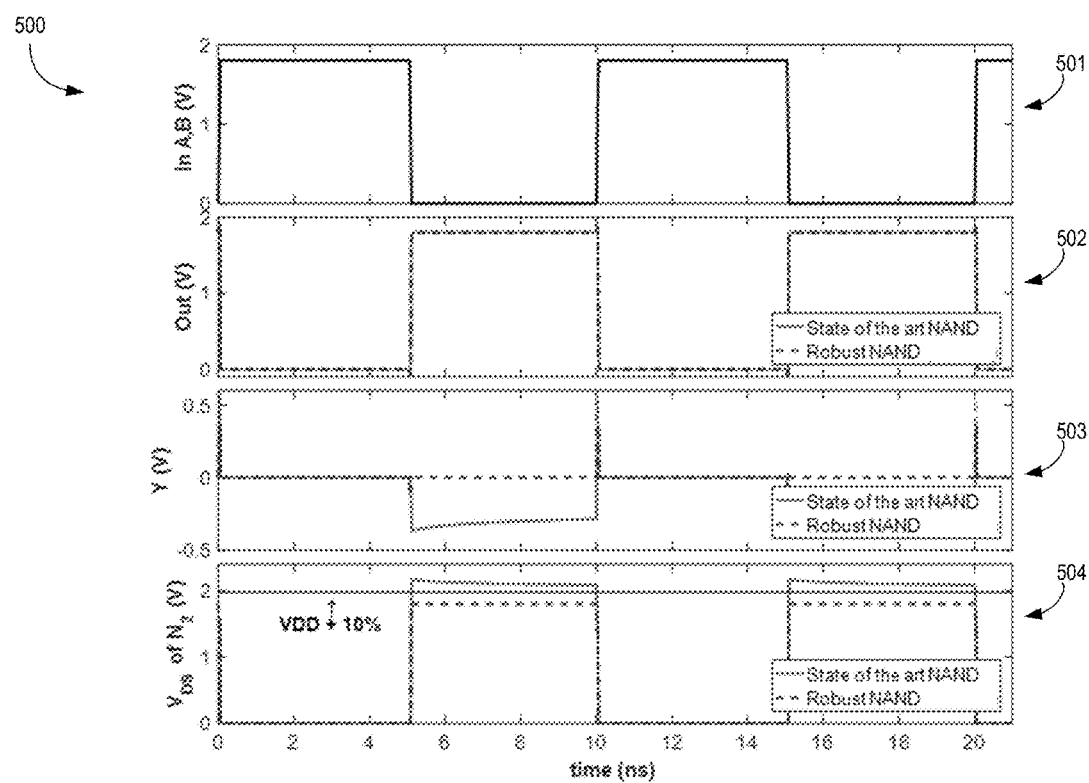
FIG. 5 illustrates a set of plots comparing transient behaviors of NAND logic gate circuit of FIGS. 4A-B, according to some embodiments of the disclosure.

FIG. 5 illustrates a set of plots 500 comparing transient behaviors of NAND logic gate circuit of FIGS. 4A-B, according to some embodiments of the disclosure. It is pointed out that those elements of FIG. 5 having the same reference numbers (or names) as the elements of any other figure can operate or function in any manner similar to that described, but are not limited to such. Plot 501 illustrates inputs at nodes 'A' and 'B' over time. Plot 502 illustrates the output voltage on node 'X' for FIG. 4A (state of the art NAND) and FIG. 4B (Robust NAND). Plot 503 illustrates the voltage on node 'Y' for FIG. 4A (state of the art NAND) and FIG. 4B (Robust NAND). Plot 504 illustrates the $V_{DS}$ of transistor MN2 for FIG. 4A (state of the art NAND) and FIG. 4B (Robust NAND).

Considering the waveforms of a state of the art solution, the following is observed: When the input signal switches from $V_{DD}$ to $V_{SS}$, causing a transition of the output 'X' from $V_{SS}$ to $V_{DD}$, the voltage at node 'Y' drops below $V_{SS}$. In the considered example, the negative voltage is caused by the capacitive voltage divider, formed by the gate-source capacitance $C_{GS}$ of transistor MN2 and the capacitance at node $$\text{'Y', } C_Y : \Delta V_Y \approx \frac{C_{GS}}{C_{GS} + C_Y} \Delta V_{in}.$$

As such, the drain-source voltage $V_{DS}$ of transistor MN2 exceeds $V_{DD}$ ($V_{DS} = V_{out} - V_Y > V_{DD}$) as shown by plot 504. It can be seen that $V_{DS}$ exceeds the maximum voltage level (typically $V_{max} = 1.05 * V_{VDD} - 1.1 *_{VDD}$) for 50% of the time and therefore poses a high reliability risk for transistor MN2.

Such conditions in stacked transistor configurations can be avoided when applying the aging tolerant apparatus, in accordance with some embodiments. When the input switches from $V_{DD}$ to $V_{SS}$, causing a transition at the output node 'X' from $V_{SS}$ to $V_{DD}$, the additional transistor MNfb is turned on. As can be seen by the transient waveforms of FIG. 5, transistor MNfb charges node 'Y' to $V_{SS}$ and thus limits $V_{DS}$ of transistor MN2 to $V_{DD}$. Note that the waveform at the NAND gate output is not influenced (or negligibly influenced) by the aging tolerant apparatus at all, in accordance with some embodiments.

Figure 6:
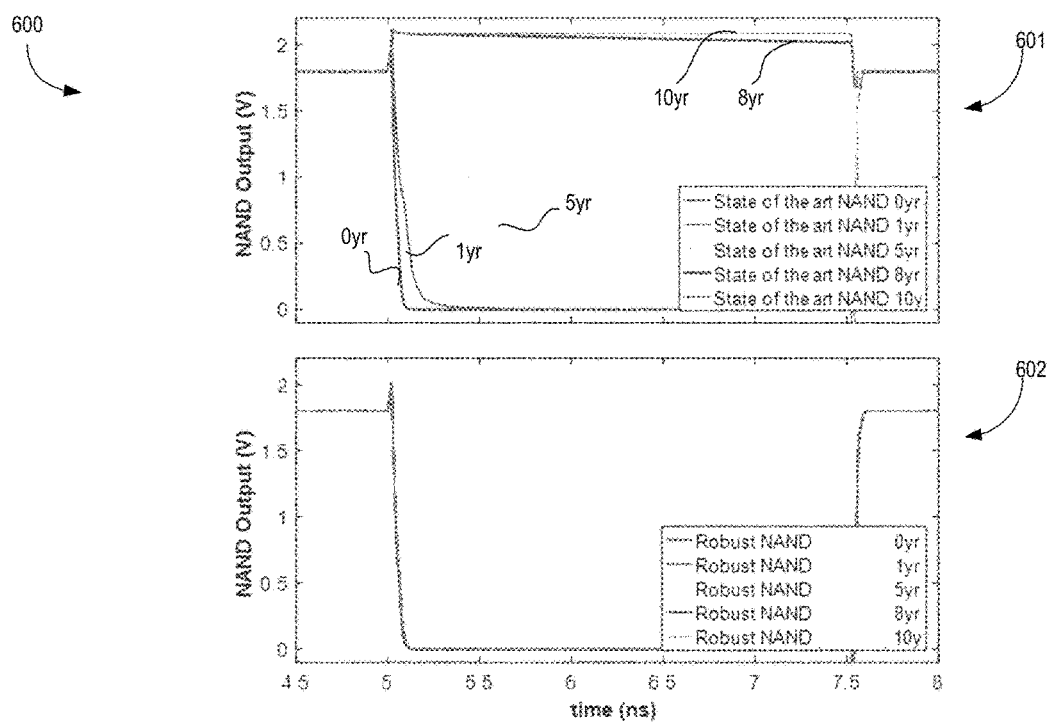
FIG. 6 illustrates a set of plots comparing transient behaviors of NAND logic gate circuit of FIGS. 4A-B over multiple years, according to some embodiments of the disclosure.

FIG. 6 illustrates a set of plots 600 comparing transient behaviors of NAND logic gate circuit of FIGS. 4A-B over multiple years, according to some embodiments of the disclosure. Plot 601 illustrates transient behaviors at output node 'X' of NAND of FIG. 4A while plot 402 illustrates transient behaviors at output node 'X' of NAND of FIG. 4B. Using the state of the art design solutions (as used in FIG. 4A), the fall time considerably rises over life time. For instance, after 8 years (yrs) the increase of the fall time is so high that the output no longer reaches the low level during one clock period (200 MHz in this example), resulting in an incorrect logic output level (e.g., circuit malfunction). Conversely, with the aging tolerant apparatus, the degradation of the output falling edge reduces significantly. For instance, even after 10 years of operation, the robust NAND gate works correctly with a negligible increase of the output fall time in the order of just 1%.

Figure 7:
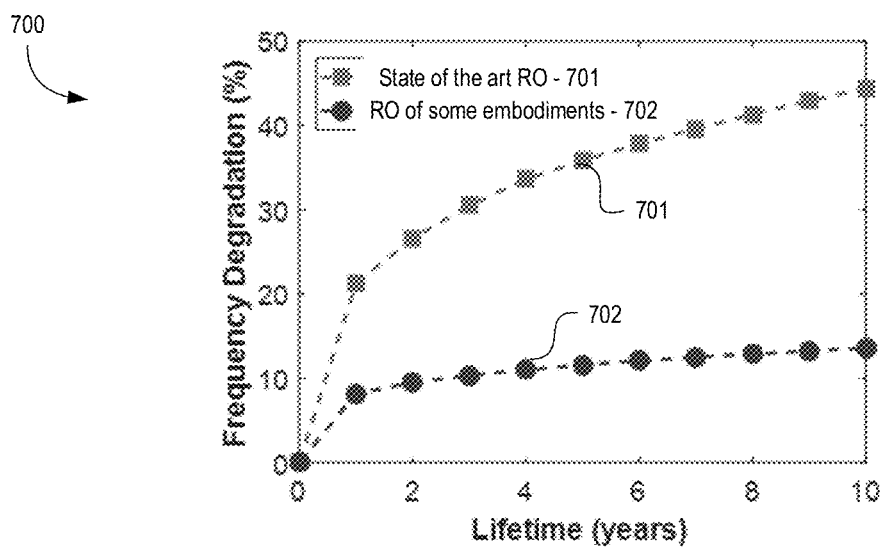
FIG. 7 illustrates a plot showing ring oscillator (RO) frequency degradation versus lifetime, according to some embodiments.

FIG. 7 illustrates plot 700 showing ring oscillator (RO) frequency degradation versus lifetime, according to some embodiments. Plot 700 compares the RO frequency degradation due to transistor aging vs. time for the state-of-the-art design solution of FIG. 4A and with the aging tolerant circuit solution of FIG. 4B. In this example, while the RO frequency with a state-of-the-art solution degrades by 45% after 10 years, the frequency degradation with the proposed solution is 14% after 10 years.

Figure 8:
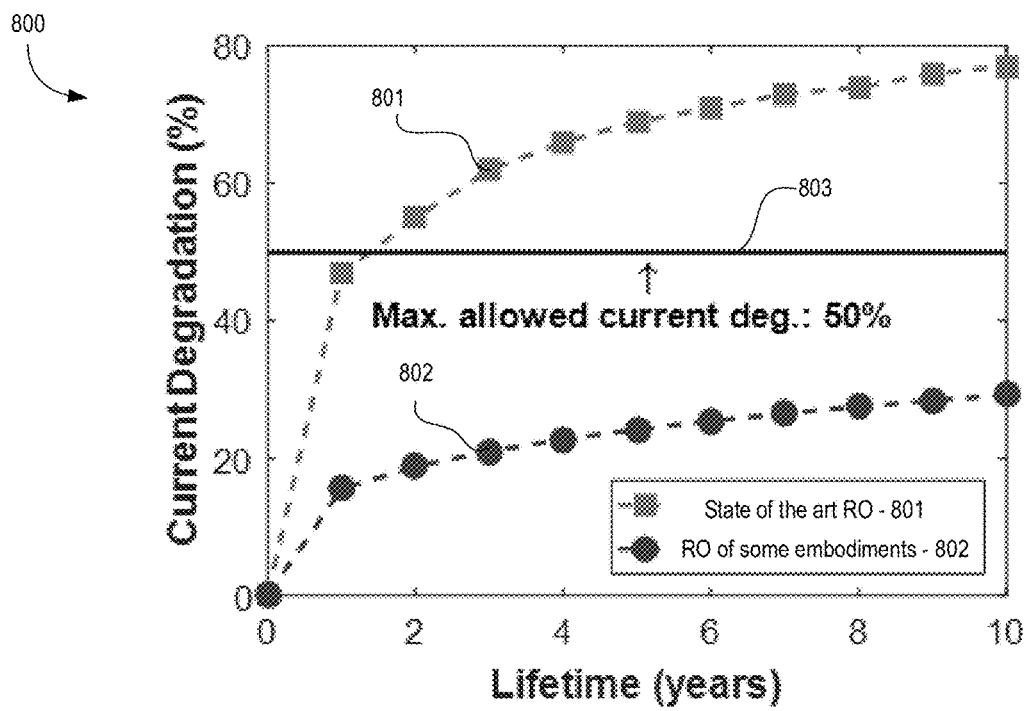
FIG. 8 illustrates a plot showing drive current degradation of transistor MN2 of FIG. 1A and FIG. 2, according to some embodiments.

FIG. 8 illustrates plot 800 showing drive current degradation of transistor MN2 of FIG. 1A and FIG. 2, according to some embodiments. Here, the drive current reduction of transistor MN2 in a single RO stage is plotted versus time. In the used technology, the drive current reduction must be below 50% to prevent the breakdown of the corresponding transistor. With state of the art solutions, this threshold limit is reached already after roughly 1 year. Thus, the state of the art solution is not able to meet requirements of products requiring more than 1 year lifetime. Conversely, employing the aging tolerant circuit technique of some embodiments, the maximum current degradation after 10 years is 28%, leaving still enough margins to the 50% threshold limit. The performance and area impact of the shown aging tolerant circuit is negligible. In the case of the NAND RO, adding the aging tolerant circuit to the state of the art solution results in an increase of the active gate area by merely 2.5%, in accordance with some embodiments.

Table 1 summarizes and compares the performance of the state-of-the art solution with the proposed solution.

TABLE 1

| Parameters | Current Solution | Aging tolerant Solution |
|---|---|---|
| Lifetime | 1 years | greater than 10 yrs |
| Area Impact | 0 | +2.5% |
| RO frequency degradation after 10 years | 45% | less than 14% |
| Drive current reduction after 10 years | 80% | 28% |

The aging tolerant circuit or apparatus of various embodiments is not limited to NAND circuits. For example, the aging tolerant circuit or apparatus of various embodiments can be implemented in other digital circuits with various stacked n-type or p-type transistors as well.

Figure 9:
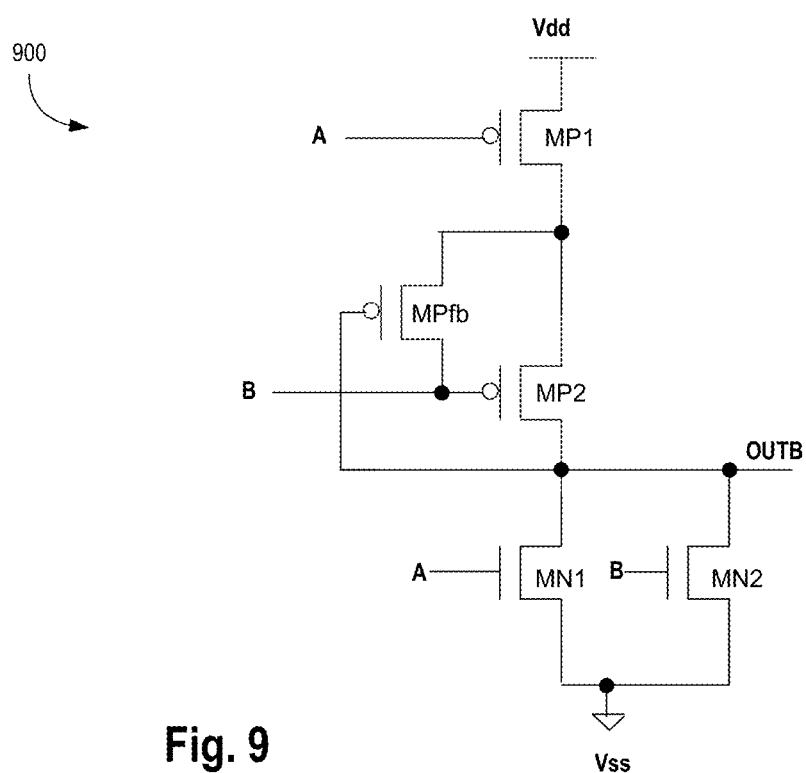
FIG. 9 illustrates an aging tolerant NOR logic gate circuit, according to some embodiments of the disclosure.

FIG. 9 illustrates an aging tolerant NOR logic gate circuit 900, according to some embodiments of the disclosure. A regular NOR logic gate circuit comprises p-type transistors MP1 and MP2, and n-type transistors MN1 and MN2 coupled together as shown with input nodes 'A' and 'B' and output node OUTB. Here, the stack of transistors is formed by p-type transistors MP1 and MP2. As discussed with reference to NAND gate of FIG. 4A, here, absent feedback p-type transistor MPfb, the transistor in the stack, here transistor MP2, suffers from excessive aging (just like transistor MN2 in FIG. 4A). Referring back to FIG. 9, to mitigate that aging, in some embodiments, feedback transistor MPbf is added coupled with transistors MP2, MP1, MN1 and MN2 as shown.

In some embodiments, feedback p-type transistor MPfb is provided which is coupled to two n-type transistors (MN1 and MN2) of the NOR gate and two p-type transistors (MP1 and MP2) of the NOR gate. In some embodiments, the feedback transistor MPfb has a gate terminal coupled to drain terminals of the two n-type transistors MN1 and MN2 of the NOR gate. In some embodiments, the feedback transistor MPfb is coupled to a gate terminal of one of the two p-type transistors (e.g., transistor MP2). In some embodiments, the feedback transistor MPfb is a p-type transistor. In some embodiments, the feedback transistor MPfb has a gate terminal coupled to the output node OUTB of the NOR gate. In some embodiments, the feedback transistor MPfb is smaller in size than one of the two p-type transistors. For example, the feedback transistor MPfb may take only 2.5% of the total area of the NOR gate 900, and may be 75% to 80% smaller than the width of transistors MP2 or MP1.

Figure 10:
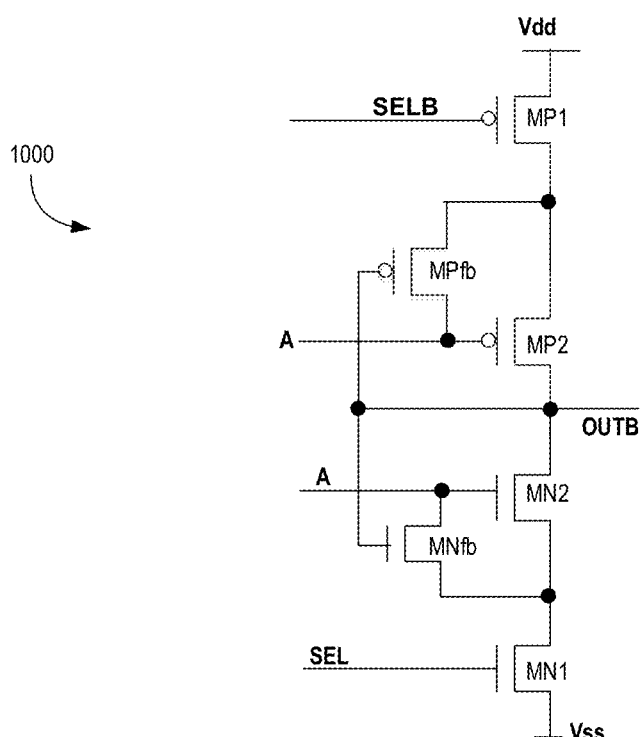
FIG. 10 illustrates an aging tolerant select circuit, according to some embodiments of the disclosure.

FIG. 10 illustrates an aging tolerant select circuit 1000, according to some embodiments of the disclosure. In some embodiments, the aging tolerant select circuit 1000 comprises p-type devices MP1, MP2, and MPfb (first feedback device), and n-type transistors MN1, MN2, and MNfb (second feedback device) coupled together as shown. A state of the art select circuit comprises transistors MP1, MP2, MN1, and MN2 without aging tolerant apparatus (e.g., feedback transistors MPfb and MNfb). The select circuit is designed to provide an inverted version of signal on node 'A' to the output node OUTB when signal on the SEL node is high and when signal on the SELB is low.

With reference to FIGS. 1A-B, here two stacks of same conductivity type exist. The first stack comprises p-type transistors MP1 and MP2, where transistor MP1 is controlled by SELB (inverse of SEL) and transistor MP2 is controlled by node 'A'. The second stack comprises n-type transistors MN1 and MN2, where transistor MN1 is controlled by SEL and transistor MN2 is controlled by node 'A'. Just as transistor MN2 of FIGS. 1A-B, experiences aging stress, transistors MP2 and MN2 of their respective stacks also face aging stress. To mitigate or reduce the aging stress, the first feedback p-type transistor MPfb is coupled to transistors MP1 and MP2 and node OUTB, and the second feedback n-type transistor MNfb is coupled to transistors MN1 and MN2 and node OUTB as shown.

Figure 11:
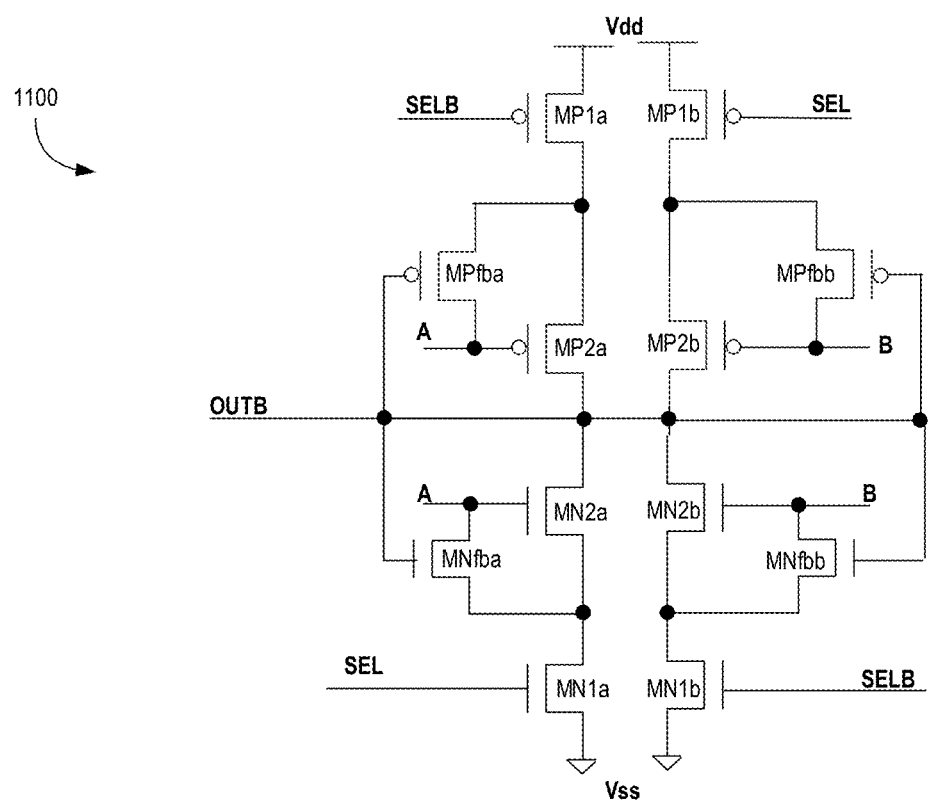
FIG. 11 illustrates an aging tolerant multiplexer circuit, according to some embodiments of the disclosure.

FIG. 11 illustrates an aging tolerant multiplexer (MUX) circuit 1100, according to some embodiments of the disclosure. It is pointed out that those elements of FIG. 11 having the same reference numbers (or names) as the elements of any other figure can operate or function in any manner similar to that described, but are not limited to such. Aging tolerant multiplexer circuit 1100 comprises two instances of aging tolerant select circuit 1000 of FIG. 10, and as such includes four feedback devices which comprise p-type transistors MPfba and MPfbb, and n-type transistors MNfba and MNfbb. In some embodiments, MUX circuit 1100 comprises p-type transistors MP1a, MP1b, MP2a, and MP2b, MPfba, and MPfbb, and n-type transistors MN1a, MN1b, MN2a, MN2b, MNfba, and MNfbb coupled together as shown. The two instances of aging tolerant select circuit 1000 of FIG. 10 are coupled together such that the output node OUTB is shared while select inputs for one of the aging tolerant select circuit are swapped.

For example, transistor MP1b is controlled by SEL node, transistor MP1a is controlled by SELB node, transistor MN1a is controlled by SEL node, and transistor MN1b is controlled by SELB node. The two inputs nodes are nodes 'A' and 'B' which are selectively provided to output node OUTB according to logic levels of signals on select nodes SEL and SELB (which is inverse of SEL). In some embodiments, the feedback devices MPfba, MPfbb, MNfba, and MNfbb provide aging tolerance to transistors MP2a, MP2b, MN2a, and MN2b, respectively.

Figure 12:
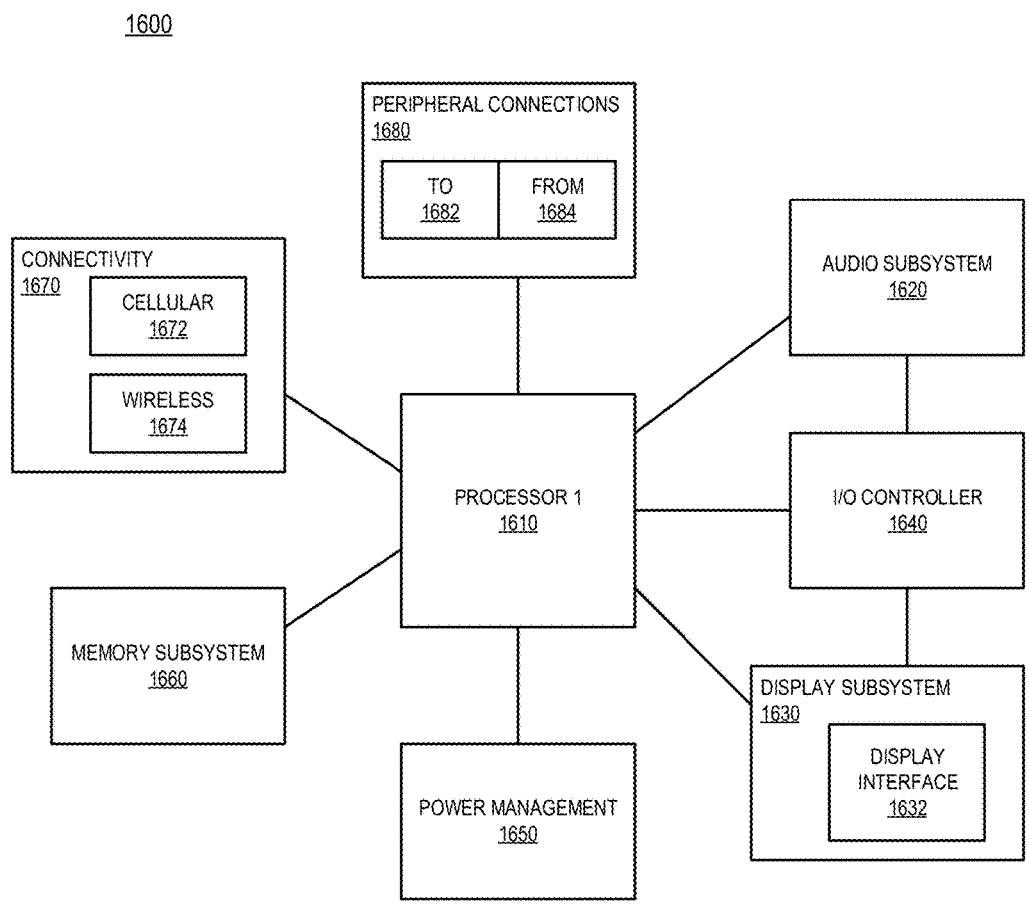
FIG. 12 illustrates a smart device or a computer system or a SoC (System-on-Chip) with aging tolerant apparatus, according to some embodiments of the disclosure.

FIG. 12 illustrates a smart device or a computer system or a SoC (System-on-Chip) with aging tolerant apparatus, according to some embodiments of the disclosure. It is pointed out that those elements of FIG. 12 having the same reference numbers (or names) as the elements of any other figure can operate or function in any manner similar to that described, but are not limited to such.

FIG. 12 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with aging tolerant apparatus, according to some embodiments discussed. Other blocks of the computing device 1600 may also include device 300, aging tolerant apparatus, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1. An apparatus comprising: a stack of transistors of a same conductivity type, the stack including a first transistor and a second transistor coupled in series and having a common node; and a feedback transistor of the same conductivity type coupled to the common node and a gate terminal of the first transistor of the stack.

Example 2. The apparatus of example 1, wherein the feedback transistor includes a gate terminal which is coupled to the first transistor of the stack.

Example 3. The apparatus according to any of the preceding examples, wherein the gate terminal of the first transistor, and a gate terminal of the second transistor are controllable by two separate control nodes.

Example 4. The apparatus according to any of the preceding examples, wherein the feedback transistor is smaller in size than one of the first or second transistors.

Example 5. An apparatus comprising: a NAND gate; and a feedback transistor coupled to two n-type transistors of the NAND gate and two p-type transistors of the NAND gate.

Example 6. The apparatus of example 5, wherein the feedback transistor has a gate terminal coupled to drain terminals of the two p-type transistors of the NAND gate.

Example 7. The apparatus of example 5, wherein the feedback transistor is coupled to a gate terminal of one of the two n-type transistors.

Example 8. The apparatus of example 5, wherein the feedback transistor is an n-type transistor.

Example 9. The apparatus according to any one of examples 5 to 8, wherein the feedback transistor has a gate terminal coupled to an output of the NAND gate.

Example 10. The apparatus according to any one of examples 5 to 9, wherein the feedback transistor is smaller in size than one of the two n-type transistors.

Example 11. An apparatus comprising: a NOR gate; and a feedback transistor coupled to two n-type transistors of the NOR gate and two p-type transistors of the NOR gate.

Example 12. The apparatus of example 11, wherein the feedback transistor has a gate terminal coupled to drain terminals of the two n-type transistors of the NOR gate.

Example 13. The apparatus of example 11, wherein the feedback transistor is coupled to a gate terminal of one of the two p-type transistors.

Example 14. The apparatus of example 11, wherein the feedback transistor is a p-type transistor.

Example 15. The apparatus according to any one of examples 11 to 15, wherein the feedback transistor has a gate terminal coupled to an output of the NOR gate.

Example 16. The apparatus according to any one of examples 11 to 15, wherein the feedback transistor is smaller in size than one of the two p-type transistors.

Example 17. A system comprising: a memory; a processor coupled to the memory, the processor including an apparatus according to any one of examples 1 to 4; and a wireless interface to allow the processor to communicate with another device.

Example 18. A system comprising: a memory; a processor coupled to the memory, the processor including an apparatus according to any one of examples 5 to 10; and a wireless interface to allow the processor to communicate with another device.

Example 19. A system comprising: a memory; a processor coupled to the memory, the processor including an apparatus according to any one of examples 11 to 16; and a wireless interface to allow the processor to communicate with another device.

Example 20. An apparatus comprising: means for clamping a high impedance node in a stack of transistors to fixed voltage.

Example 21. The apparatus of example 20 comprising means for controlling the transistors of the stack by two separate control nodes.

Example 22. The apparatus of example 20 comprising the means for clamping is smaller in size than one of the transistors of the stack.

Example 23. A method comprising: clamping a high impedance node in a tack of transistors to fixed voltage.

Example 24. The method of example 23 comprising controlling the transistors of the stack by two separate control nodes.

Example 25. The method of example 23 comprising clamping is smaller in size than one of the transistors of the stack.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a stack of transistors of a same conductivity type, the stack including a first transistor and a second transistor coupled in series and having a common node; and
a feedback transistor of the same conductivity type coupled to the common node and a gate terminal of the first transistor of the stack, wherein one of a source or drain terminal of the feedback transistor is coupled to the gate terminal of the first transistor of the stack, and wherein one of the drain or source terminal of the feedback transistor is coupled to the common node.

2. The apparatus of claim 1, wherein the feedback transistor includes a gate terminal which is coupled to the first transistor of the stack.

3. The apparatus of claim 1, wherein the gate terminal of the first transistor, and a gate terminal of the second transistor are controllable by two separate control nodes.

4. The apparatus of claim 1, wherein the feedback transistor is smaller in size than one of the first or second transistors.

5. An apparatus comprising:
a stack of transistors of a same conductivity type, the stack including a first transistor and a second transistor coupled in series and having a common node; and
a feedback transistor of the same conductivity type coupled to the common node and a gate terminal of the first transistor of the stack, wherein the feedback transistor is smaller in size than one of the first or second transistors.

6. The apparatus of claim 5, wherein the gate terminal of the first transistor, and a gate terminal of the second transistor are controllable by two separate control nodes.

7. An apparatus comprising:
a NAND gate; and
a feedback transistor coupled to two n-type transistors of the NAND gate and two p-type transistors of the NAND gate, wherein the feedback transistor is smaller in size than one of the two n-type transistors.

8. The apparatus of claim 7, wherein the feedback transistor has a gate terminal coupled to drain terminals of the two p-type transistors of the NAND gate.

9. The apparatus of claim 7, wherein the feedback transistor is coupled to a gate terminal of one of the two n-type transistors.

10. The apparatus of claim 7, wherein the feedback transistor is an n-type transistor.

11. The apparatus of claim 7, wherein the feedback transistor has a gate terminal coupled to an output of the NAND gate.

12. An apparatus comprising:
a NOR gate; and
a feedback transistor coupled to two n-type transistors of the NOR gate and two p-type transistors of the NOR gate, wherein the feedback transistor is a p-type transistor.

13. The apparatus of claim 12, wherein the feedback transistor has a gate terminal coupled to drain terminals of the two n-type transistors of the NOR gate.

14. The apparatus of claim 12, wherein the feedback transistor is coupled to a gate terminal of one of the two p-type transistors.

15. The apparatus of claim 12, wherein the feedback transistor has a gate terminal coupled to an output of the NOR gate.

16. The apparatus of claim 12, wherein the feedback transistor is smaller in size than one of the two p-type transistors.

17. A system comprising:
a memory;
a processor coupled to the memory, the processor including:
a stack of transistors of a same conductivity type, the stack including a first transistor and a second transistor coupled in series and having a common node; and
a feedback transistor of the same conductivity type coupled to the common node and a gate terminal of the first transistor of the stack, wherein one of a source or drain terminal of the feedback transistor is coupled to the gate terminal of the first transistor of the stack, and wherein one of the drain or source terminal of the feedback transistor is coupled to the common node; and
a wireless interface to allow the processor to communicate with another device.

18. The system of claim 17, wherein the feedback transistor includes a gate terminal which is coupled to the first transistor of the stack.

19. The system of claim 17, wherein the gate terminal of the first transistor, and a gate terminal of the second transistor are controllable by two separate control nodes.

20. The system of claim 17, wherein the feedback transistor is smaller in size than one of the first or second transistors.

* * * * *